US012412775B2

(12) United States Patent
Yen et al.

(10) Patent No.: US 12,412,775 B2
(45) Date of Patent: Sep. 9, 2025

(54) ISOLATION STRUCTURES IN SEMICONDUCTOR DEVICES

(71) Applicant: Taiwan Semiconductor Manufacturing Company, Ltd., Hsinchu (TW)

(72) Inventors: Fu-Ting Yen, Hsinchu (TW); Wei-Ting Yeh, Hsinchu (TW); Shih-Cheng Chen, New Taipei (TW); Yu-Yun Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 747 days.

(21) Appl. No.: 17/591,416

(22) Filed: Feb. 2, 2022

(65) Prior Publication Data

US 2023/0009820 A1 Jan. 12, 2023

Related U.S. Application Data

(60) Provisional application No. 63/219,958, filed on Jul. 9, 2021.

(51) Int. Cl.
*H01L 21/762* (2006.01)
*H01L 21/02* (2006.01)
(Continued)

(52) U.S. Cl.
CPC .... *H01L 21/76224* (2013.01); *H01L 21/0259* (2013.01); *H10D 30/031* (2025.01);
(Continued)

(58) Field of Classification Search
CPC ......... H01L 29/42392; H01L 29/78696; H01L 29/66439; H01L 29/0673; H01L 21/823431; H01L 29/66545; H01L 29/775; H01L 29/0847; H01L 29/165; H01L 21/02532; H01L 21/02603; H01L 21/76224; H01L 21/76805; H01L 21/76897; H01L 21/823412;
(Continued)

(56) References Cited

U.S. PATENT DOCUMENTS 6,010,968 A * 1/2000 Yang ................. H01L 21/31116
438/719
9,093,530 B2 7/2015 Huang et al.
(Continued)

*Primary Examiner* — Wael M Fahmy
*Assistant Examiner* — Fernando Jose Ramos-Diaz
(74) *Attorney, Agent, or Firm* — Sterne, Kessler, Goldstein &Fox P.L.L.C.

(57) ABSTRACT

A semiconductor device with isolation structures and a method of fabricating the same are disclosed. The method includes forming a fin structure on a substrate forming a superlattice structure with first and second nanostructured layers on the fin structure, forming a source/drain (S/D) opening in the superlattice structure, forming an isolation opening in the fin structure and below the S/D opening, forming a first isolation layer in the isolation opening, selectively forming an oxide layer on sidewalls of the S/D opening, selectively forming an inhibitor layer on the oxide layer, selectively depositing a second isolation layer on the first isolation layer, and forming S/D regions in the S/D opening on the second isolation layer.

20 Claims, 16 Drawing Sheets

(51) Int. Cl.
*H10D 30/01* (2025.01)
*H10D 30/67* (2025.01)
*H10D 62/10* (2025.01)
*H10D 64/01* (2025.01)

(52) U.S. Cl.
CPC ..... *H10D 30/6713* (2025.01); *H10D 30/6735* (2025.01); *H10D 30/6757* (2025.01); *H10D 62/116* (2025.01); *H10D 62/118* (2025.01); *H10D 64/017* (2025.01); *H10D 64/018* (2025.01)

(58) Field of Classification Search
CPC ..... H01L 21/823418; H01L 21/823437; H01L 21/823468; H01L 21/823475; H01L 27/0886; H01L 27/0922; H01L 27/1203; H01L 29/0665; H01L 29/0676; H01L 29/1033; H01L 29/1079; H01L 29/16; H01L 29/41733; H01L 29/41775; H01L 29/66553; H01L 29/6656; H01L 29/66742; H01L 29/66795; H01L 29/6681; H01L 29/7848; H01L 29/785; H01L 29/7851; H01L 29/78618; H01L 29/78654; H01L 29/78684; B82Y 10/00
See application file for complete search history.

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 10,170,638 B1* | 1/2019 | Reznicek ............ H01L 29/0649 |
| 2016/0351591 A1* | 12/2016 | Xie ........................ H01L 21/845 |
| 2017/0141199 A1* | 5/2017 | Demuynck ......... H01L 29/0847 |
| 2017/0317466 A1* | 11/2017 | Huang ................... H01L 29/78 |
| 2019/0103276 A1* | 4/2019 | Peng ................ H01L 21/02208 |
| 2020/0075342 A1* | 3/2020 | Chen ................ H01L 21/31144 |
| 2020/0388677 A1* | 12/2020 | Chu ...................... H01L 29/785 |
| 2021/0028187 A1* | 1/2021 | Byeon ............... H01L 21/02636 |
| 2023/0215784 A1* | 7/2023 | Matsumoto ....... H01L 21/76811 257/773 |
| 2023/0261047 A1* | 8/2023 | Min ................ H01L 21/823481 257/386 |

* cited by examiner

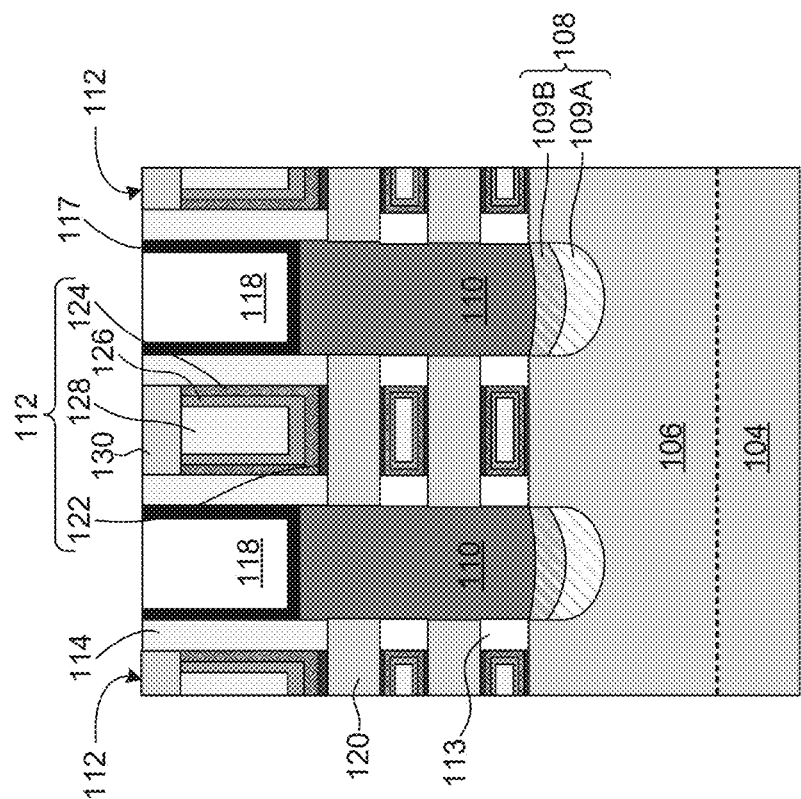
Fig. 14
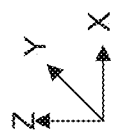

ISOLATION STRUCTURES IN SEMICONDUCTOR DEVICES

CROSS-REFERENCE TO RELATED APPLICATIONS

This application claims the benefit of U.S. Provisional Patent Application No. 63/219,958, titled "Isolation Structures in Semiconductor Devices," filed Jul. 9, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 4-14 illustrate cross-sectional views of a semiconductor device with isolation structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
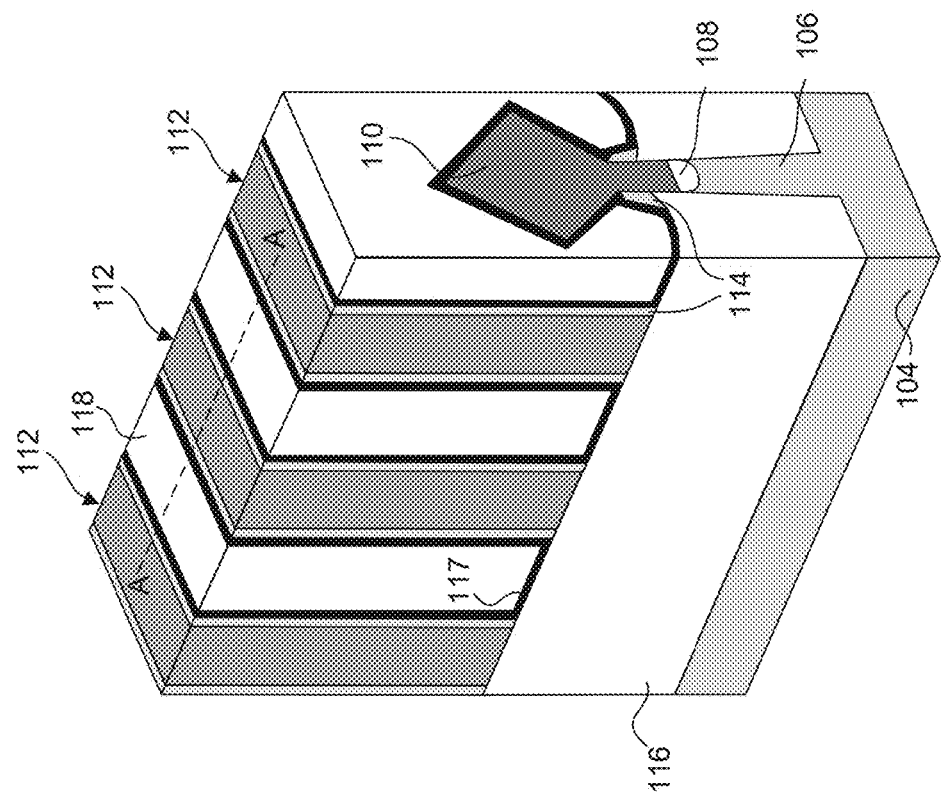
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices with FETs (e.g., gate-all-around (GAA) FETs) having isolation structures between fin structures and source/drain (S/D) regions and provides example methods of forming such FETs on a substrate. The isolation structures prevent or minimize current leakage from S/D regions to fin structures and substrate. In some embodiments, each of the isolation structures can include a stack of first and second isolation layers. The first isolation layer can include a doped oxide layer, and the second isolation layer can include a doped oxide, carbide, or nitride layer. In some embodiments, the first and/or second isolation layers can have a carbon-to-nitrogen concentration ratio of about 0.2 to about 2 for low dielectric constant value of about 2 to about 5, density of about 1.5 gm/cm$^3$ to about 3 gm/cm$^3$, and etch selectivity over undoped oxide (e.g., silicon oxide (SiO$_2$)).

In some embodiments, the method of forming the first and second isolation layers include forming an isolation opening in the fin structure, forming the first isolation layer in the isolation opening, and selectively depositing the second isolation layer on the first isolation layer. The selective deposition of the second isolation layer forms the second isolation layer with a top surface profile that is more planar than that formed with other methods, such as cyclic deposition-etch (CDE) processes. The top surface profile and dimensions (e.g., thickness) can be controlled more precisely in the selective deposition process than in CDE processes as controlling etching conditions and/or etch profiles in CDE processes are more challenging than controlling deposition conditions. The substantially planar top surface profile of the second isolation layer can prevent and/or substantially reduce the formation of voids at the interface between the second isolation layer and the S/D region formed on the second isolation layer, and consequently improve device performance.

Figure 1B:
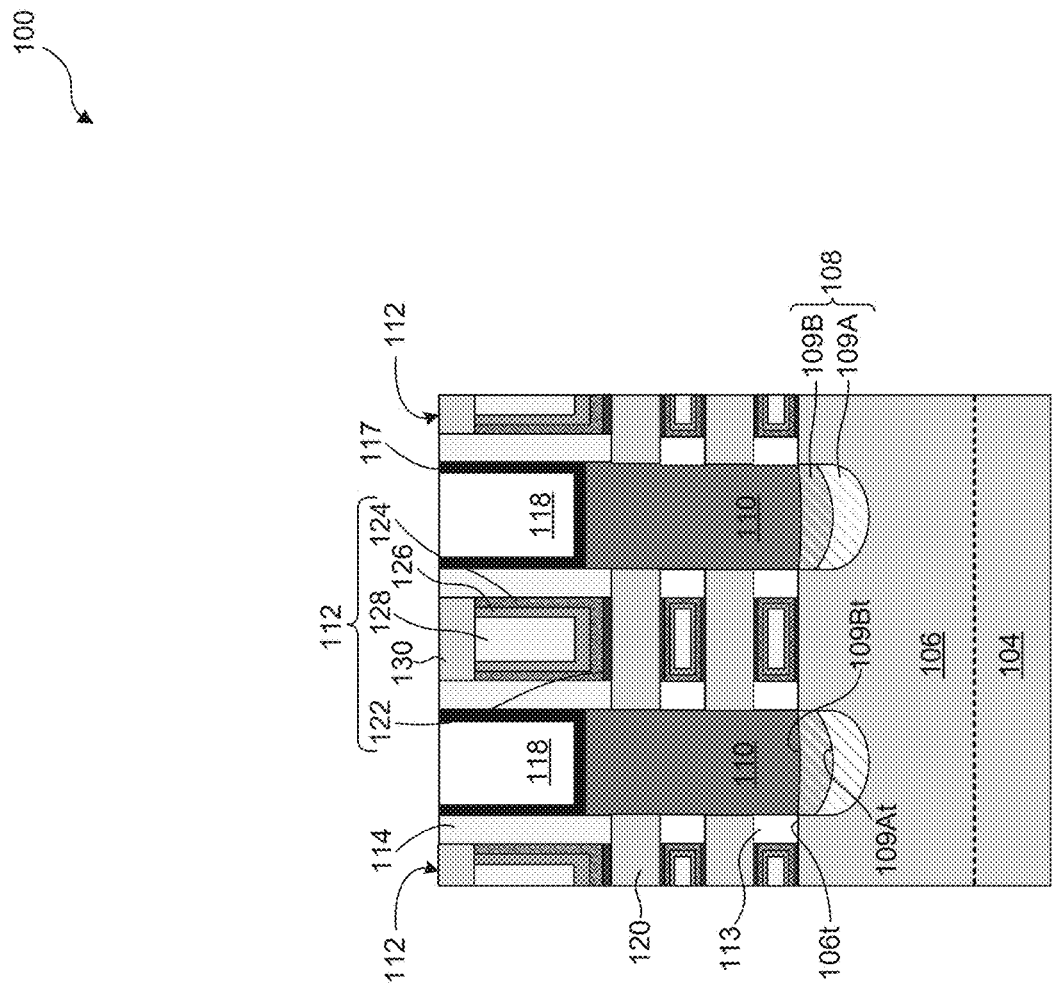
FIG. 1B illustrates a cross-sectional view of a semiconductor device with isolation structures, in accordance with some embodiments.

FIG. 1A illustrates an isometric view of a FET 100, according to some embodiments. FIG. 1B illustrates cross-sectional view of FET 100, along line A-A of FIG. 1A, with additional structures that are not shown in FIG. 1A for simplicity. Referring to FIGS. 1A and 1B, in some embodiments, FET 100 can include a fin structure 106, an array of gate structures 112 disposed on fin structure 106, stacks of nanostructured channel regions 120 surrounded by gate structures 112, an array of S/D regions 110 disposed on portions of fin structure 106 that are not covered by gate structures 112, isolation structures 108 disposed between fin structure 106 and S/D region 110, inner spacers 113, gate spacers 114, shallow trench isolation (STI) regions 116, etch stop layer (ESL) 117, and interlayer dielectric (ILD) layer 118. ILD layer 118 can be disposed on ESL 117. ESL 117 can be configured to protect gate structures 112 and/or S/D regions 110. In some embodiments, inner spacers 113, gate spacers 114, STI regions 116, ESL 117, and ILD layers 118 can include an insulating material, such as silicon oxide, silicon nitride (SiN), nitrogen-doped silicon carbide (SiCN), silicon oxycarbon nitride (SiOCN), and silicon germanium oxide. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm are within the scope of the disclosure.

FET 100 can be formed on a substrate 104. In some embodiments, substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structure 106 can include a material similar to substrate 104 and extend along an X-axis.

In some embodiments, for NFET 100, each of S/D regions 110 can include an epitaxially-grown semiconductor material, such as Si, and n-type dopants, such as phosphorus and other suitable n-type dopants. In some embodiments, for PFET 100, each of S/D regions 110 can include an epitaxially-grown semiconductor material, such as Si and SiGe, and p-type dopants, such as boron and other suitable p-type dopants.

Isolation structures 108 can be configured to electrically isolate S/D regions 110 from fin structure 106 and substrate 104. Each of isolation structures 108 can include a first isolation layer 109A disposed on fin structure 106 and a second isolation layer 109B disposed on first isolation layer 109B. In some embodiments, first and second isolation layers 109A and 109B can include dielectric materials similar to or different from each other.

In some embodiments, first isolation layer 109A can include a doped oxide layer, such as carbon-doped silicon oxide layer, nitrogen-doped silicon oxide layer, and carbon- and nitrogen-doped silicon oxide layer. In some embodiments, first isolation layer 109A can include a carbon- and nitrogen-doped silicon oxide layer with a carbon concentration of about 1 atomic % to about 25 atomic % and a nitrogen concentration of about 1 atomic % to about 30 atomic %. In some embodiments, first isolation layer 109A can include a carbon- and nitrogen-doped silicon oxide layer with a carbon-to-nitrogen concentration ratio of about 0.2 to about 2. Within these concentration ranges of carbon and nitrogen, first isolation layer 109A can have a density of about 1.5 gm/cm$^3$ to about 3 gm/cm$^3$ and a dielectric constant of about 2 to about 5. If the density is less than 1.5 gm/cm$^3$, first isolation layer 109A may be damaged (e.g., etched) during subsequent processing (e.g., etching processes). On the other hand, if the density is greater than 3 gm/cm$^3$, the dielectric constant of first isolation layer 109A may be greater than 5, which can increase parasitic capacitance of FET 100 and degrade device performance. In some embodiments, the density range of about 1.5 gm/cm$^3$ to about 3 gm/cm$^3$ can keep fluorine contaminants in first isolation layer 109A from processing chemicals (e.g., etchants) to a concentration less than about 2 atomic % (e.g., about 0 atomic % to about 1.9 atomic %).

In some embodiments, first isolation layer 109A can have a top surface 109At with a curved profile. In some embodiments, edges of top surface 109At can be below top surface 106t of fin structure 106, as shown in FIG. 1B. In some embodiments, edges of top surface 109At can be above top surface 106t (not shown).

In some embodiments, second isolation layer 109B can include (i) a doped oxide layer, such as carbon-doped silicon oxide layer, nitrogen-doped silicon oxide layer, and carbon- and nitrogen-doped silicon oxide layer, (ii) a doped carbide layer, such as oxygen-doped silicon carbide layer, nitrogen-doped silicon carbide layer, and oxygen- and nitrogen-doped silicon carbide layer, (iii) a doped nitride layer, such as oxygen-doped silicon nitride layer, carbon-doped silicon nitride layer, and oxygen- and carbon-doped silicon nitride layer, or (iv) an undoped silicon nitride layer.

In some embodiments, second isolation layer 109B can include a doped oxide, carbide, or nitride layer with a carbon concentration of about 1 atomic % to about 25 atomic % and a nitrogen concentration of about 1 atomic % to about 30 atomic %. In some embodiments, second isolation layer 109B can include a doped oxide, carbide, or nitride layer with a carbon-to-nitrogen concentration ratio of about 0.2 to about 2. Similar to first isolation layer 109A, within these concentration ranges of carbon and nitrogen, second isolation layer 109B can have a density of about 1.5 gm/cm$^3$ to about 3 gm/cm$^3$ and a dielectric constant of about 2 to about 5. If the density is less than 1.5 gm/cm$^3$, second isolation layer 109B may be damaged (e.g., etched) during subsequent processing (e.g., etching processes). On the other hand, if the density is greater than 3 gm/cm$^3$, the dielectric constant of second isolation layer 109B may be greater than 5, which can increase parasitic capacitance of FET 100 and degrade device performance. In some embodiments, the density range of about 1.5 gm/cm$^3$ to about 3 gm/cm$^3$ can keep fluorine contaminants in second isolation layer 109B from processing chemicals (e.g., etchants) to a concentration less than about 2 atomic % (e.g., about 0 atomic % to about 1.9 atomic %).

In some embodiments, carbon and nitrogen concentrations in first and second isolation layers 109A and 109B can be equal to or different from each other. In some embodiments, carbon and nitrogen concentrations in second isolation layer 109B can be greater than that in first isolation layer 109A. The higher carbon concentration in second isolation layer 109B can provide a lower dielectric constant in second isolation layer 109B than that in first isolation layer 109A. The lower dielectric constant in second isolation layer 109B can minimize parasitic capacitance between S/D regions 110 and gate structures 112. The higher nitrogen concentration in second isolation layer 109B can provide higher etch selectivity over oxide in second isolation layer 109B than in first isolation layer 109A. The higher etch selectivity can protect second isolation layer 109B during subsequent etching processes. In some embodiments, nitrogen concentration in second isolation layer 109B can be greater and carbon concentration can be smaller than that in first isolation layer 109A.

In some embodiments, first isolation layer 109A can have a top surface 109At with a curved profile. In some embodiments, edges of top surface 109At can be below top surface 106t of fin structure 106, as shown in FIG. 1B. In some embodiments, edges of top surface 109At can be above (not shown) top surface 106t and in physical contact with inner spacers 113 that are disposed on top surface 106t.

In some embodiments, second isolation layer 109B can have a top surface 109Bt with a profile that is less curved than top surface 109At of first isolation layer 109A. Second isolation layer 109B can be formed on first isolation layer 109A to improve the interface (e.g., reduce defects and/or air gaps) between isolation structure 108 and S/D region 110. In some embodiments, edges of top surface 109Bt can be at the same plane as top surface 106t when top surface 109At of first isolation layer 109A is below top surface 106t. In some embodiments, edges of top surface 109Bt can be above (not shown) top surface 106t and in physical contact with inner spacers 113 that are disposed on top surface 106t when top surface 109At is above or below top surface 106t. In some embodiments, top surface 109Bt can have a substantially planar profile and can be substantially coplanar with top surface 106t.

In some embodiments, each of first and second isolation layers 109A and 109B can have a thickness along a Z-axis of about 5 nm to about 15 nm. In some embodiments, a thickness of second isolation layer 109B is greater than that of first isolation layer 109A. Within these thickness ranges of first and second isolation layers 109A and 109B, adequate electrical isolation can be provided by isolation structures 108 between S/D regions 110 and fin structure 106 without compromising the device size and manufacturing cost.

In some embodiments, nanostructured channel regions 120 can include semiconductor materials similar to or different from substrate 104. In some embodiments, nanostructured channel regions 120 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 120 are shown, nanostructured channel regions 120 can have cross-sections of other geometric shapes (e.g., circular, elliptical, triangular, or polygonal).

In some embodiments, gate structures 112 can be multi-layered structures and can surround each of nanostructured channel regions 120 for which gate structures 112 can be referred to as "gate-all-around (GAA) structures" or "horizontal gate-all-around (HGAA) structures." FET 100 can be referred to as "GAA FET 100." The portions of gate structures 112 surrounding nanostructured channel regions 120 can be electrically isolated from adjacent S/D regions 110 by inner spacers 113. Inner spacers 113 can include a material similar to gate spacers 114. In some embodiments, FET 100 can be a finFET and have fin regions (not shown) instead of nanostructured channel regions 120.

Referring to FIG. 1B, in some embodiments, each of gate structures 112 can include an interfacial oxide (IO) layer 122, a high-k (HK) gate dielectric layer 124 disposed on IO layer 122, a work function metal (WFM) layer 126 disposed on HK gate dielectric layer 124, a gate metal fill layer 128 disposed on WFM layer 126, and a gate capping layer 130 disposed on HK gate dielectric layer 124, WFM layer 126, and gate metal fill layer 128.

In some embodiments, IO layers 122 can include silicon oxide ($SiO_2$), silicon germanium oxide ($SiGeO_x$), or germanium oxide ($GeO_x$). In some embodiments, HK gate dielectric layers 124 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). In some embodiments, WFM layers 126 of gate structures 112 of NFET 100 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, a combination thereof, or other suitable Al-based materials. In some embodiments, WFM layers 126 of gate structures 112 of PFET 100 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. In some embodiments, gate metal fill layers 128 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof. In some embodiments, gate structures 112 can be electrically isolated from overlying interconnect structures (not shown) by gate capping layers 130, which can include nitride layers.

Figure 2:
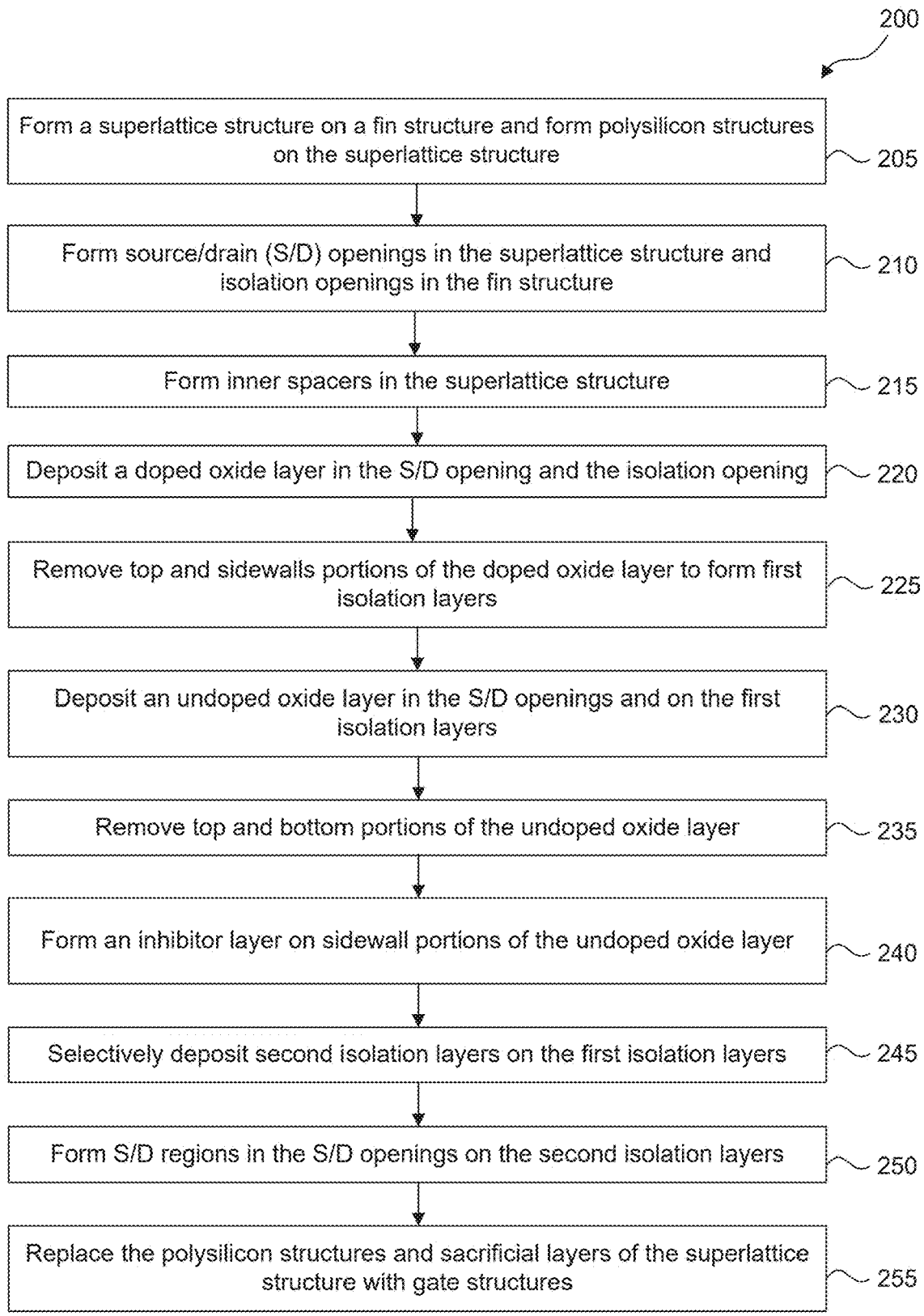
FIG. 2 is a flow diagram of a method for fabricating a semiconductor device with isolation structures, in accordance with some embodiments.

FIG. 2 is a flow diagram of an example method 200 for fabricating FET 100, according to some embodiments. For illustrative purposes, the operations illustrated in FIG. 2 will be described with reference to the example fabrication process for fabricating FET 100 as illustrated in FIGS. 3-16. FIGS. 3-14 are cross-sectional views of FET 100 along line A-A of FIG. 1 at various stages of fabrication, according to some embodiments. Operations can be performed in a different order or not performed depending on specific applications. It should be noted that method 200 may not produce a complete FET 100. Accordingly, it is understood that additional processes can be provided before, during, and after method 200, and that some other processes may only be briefly described herein. Elements in FIGS. 3-14 with the same annotations as elements in FIGS. 1A and 1B are described above.

Figure 3:
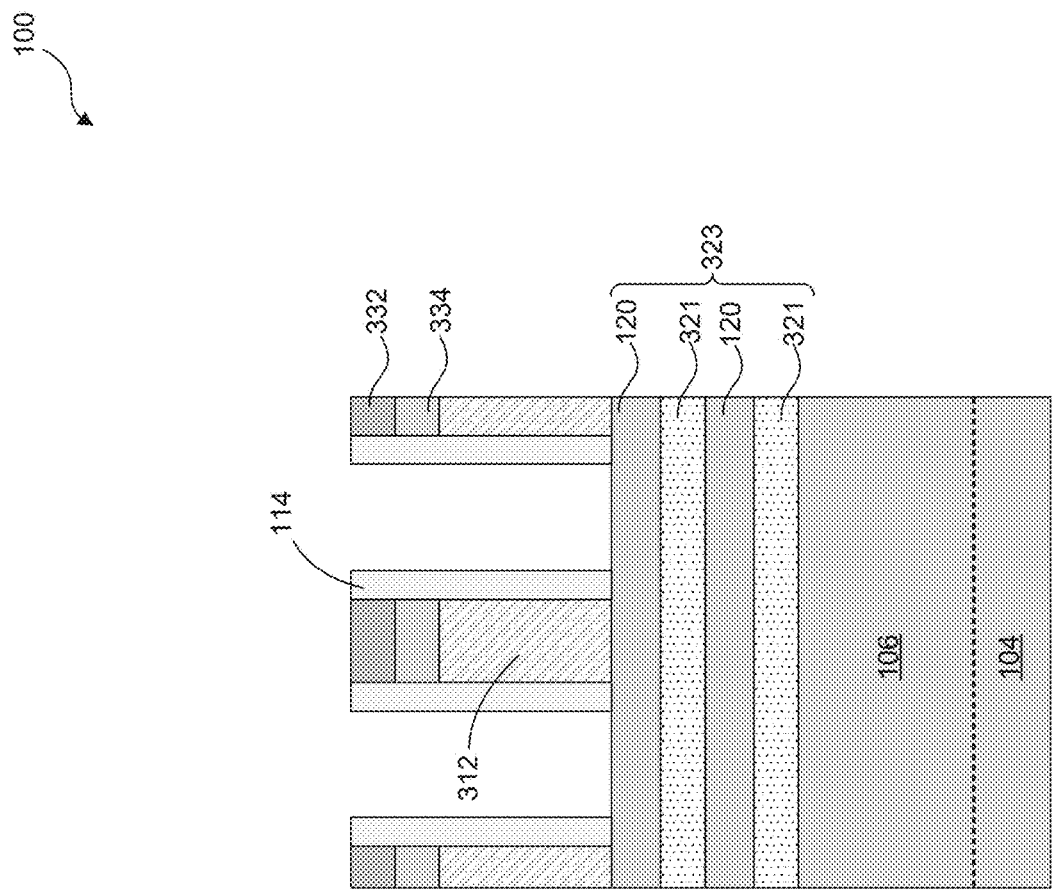

In operation 205, a superlattice structure is formed on a fin structure, and polysilicon structures are formed on the superlattice structure. For example, as shown in FIG. 3, superlattice structure 323 is formed on fin structure 106 and polysilicon structures 312 are formed on superlattice structure 323. Superlattice structure 323 can include nanostructured layers 120 and 321 arranged in an alternating configuration. In some embodiments, nanostructured layers 120 and 321 include materials similar to each other. Nanostructured layers 321 are also referred to as sacrificial layers 321. During subsequent processing, polysilicon structures 312 and sacrificial layers 321 can be replaced in a gate replacement process to form gate structures 112. In some embodiments, hard mask layers 332 and 334 are formed on polysilicon structures 321. In some embodiments, hard mask layers 332 can include oxide layers and hard mask layers 334 can include nitride layers.

Figure 4:
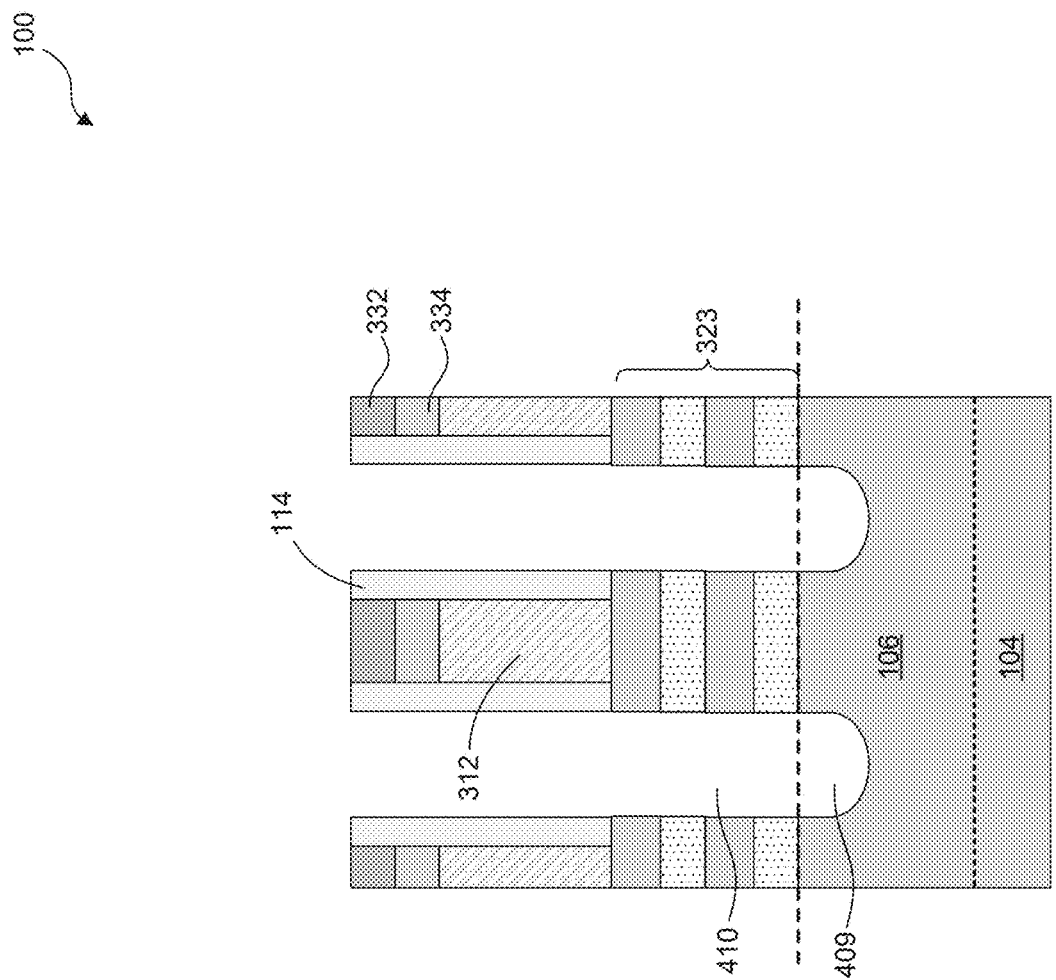

Referring to FIG. 2, in operation 210, S/D openings in the superlattice structure and isolation openings in the fin structure are formed. For example, as shown in FIG. 4, S/D openings 410 are formed within superlattice structure 323 and isolation openings 409 are formed in fin structure 106. In some embodiments, heights of S/D openings 410 along a Z-axis are about 2 to about 5 times greater than heights of isolation openings 409 along a Z-axis. In some embodiments, S/D openings 410 and isolation openings 409 can be formed by etching superlattice structure 323 and fin structure 106 in a dry etch process.

Figure 5:
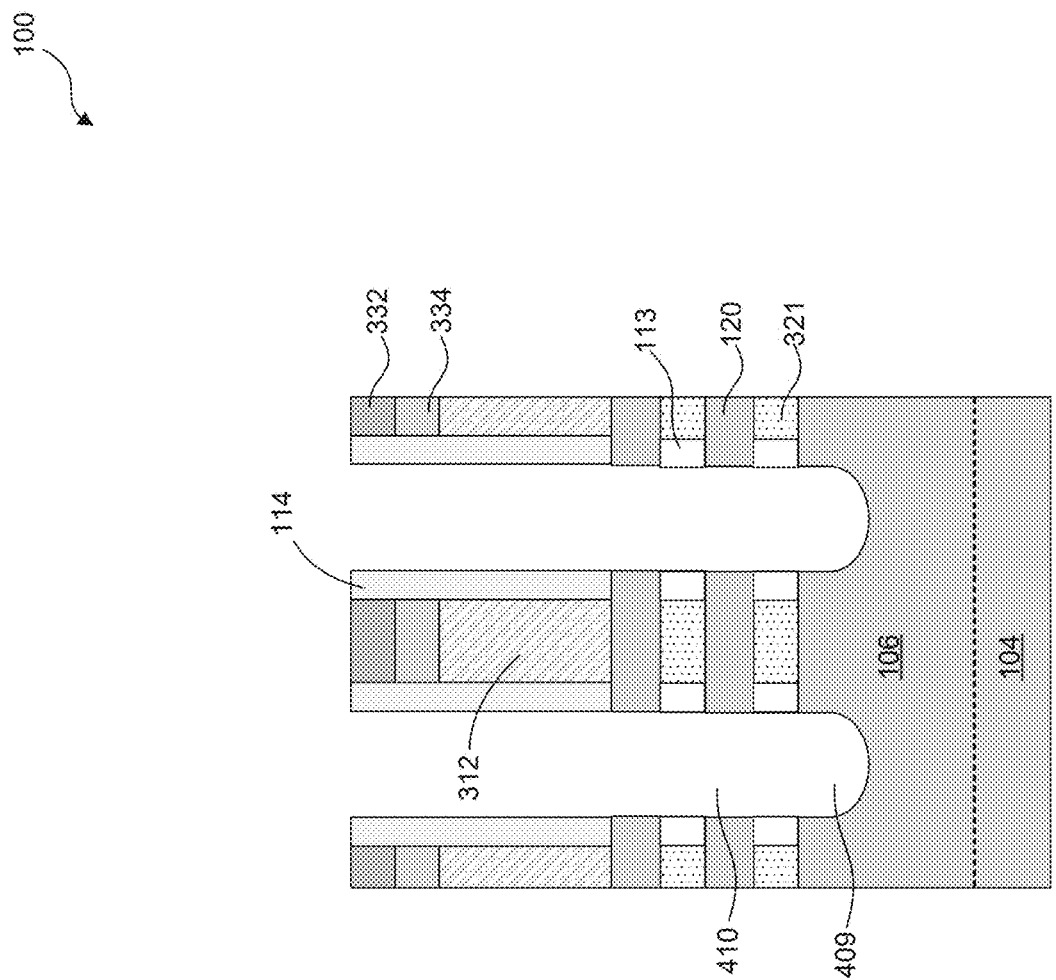

Referring to FIG. 2, in operation 215, inner spacers are formed in the superlattice structure. For example, as shown in FIG. 5, inner spacers 113 are formed in superlattice structure 323. The formation of inner spacers 113 can include sequential operations of (i) etching nanostructured layers 321 along an X-axis, (ii) depositing an insulating material on the etched nanostructured layers 321, and (iii) etching the deposited insulating material to form inner spacers 113, as shown in FIG. 5.

Referring to FIG. 2, in operations 220-225, first isolation layers are formed in the isolation openings. For example, first isolation layers 109A are formed in isolation openings in operations 220-225, as described below with reference to FIGS. 6-7.

Figure 6:
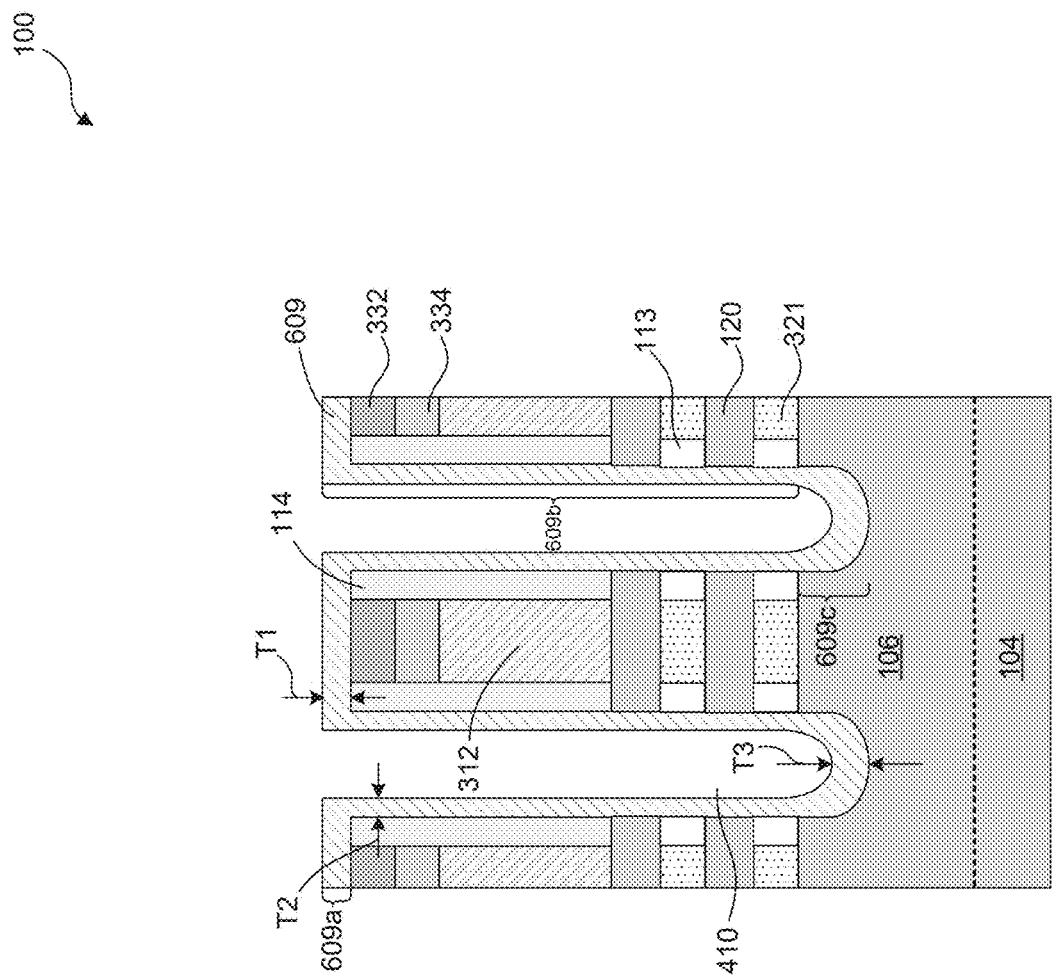

Referring to FIG. 2, in operation 220, a doped oxide layer is deposited in the S/D opening and the isolation opening. For example, as shown in FIG. 6, a doped oxide layer 609 is conformally deposited in S/D openings 410 and isolation openings 409. In some embodiments, the deposition of doped oxide layer 609 can include depositing a carbon-doped silicon oxide layer, a nitrogen-doped silicon oxide layer, or a carbon- and nitrogen-doped silicon oxide layer on the structure of FIG. 5 using an atomic layer deposition (ALD) process or a chemical vapor deposition (CVD) process. In some embodiments, the deposition of doped oxide layer 609 can include depositing a carbon- and nitrogen-doped silicon oxide layer on the structure of FIG. 5 with a carbon concentration of about 1 atomic % to about 25 atomic % and a nitrogen concentration of about 1 atomic % to about 30 atomic %, and a carbon-to-nitrogen concentration ratio of about 0.2 to about 2. Within these concentration ranges of carbon and nitrogen, doped oxide layer 609 with a density of about 1.5 gm/cm$^3$ to about 3 gm/cm$^3$ can be formed. If the density is less than 1.5 gm/cm$^3$, controlling the etched profile of doped oxide layer 609 during a subsequent etch process (e.g., operation 225) can be challenging.

On the other hand, if the density is greater than 3 gm/cm$^3$, the processing time for etching doped oxide layer 609 during the subsequent etch process increases, and consequently increases device manufacturing cost. In some embodiments, the density range of about 1.5 gm/cm$^3$ to about 3 gm/cm$^3$ can keep fluorine contaminants in doped oxide layer 609 from processing chemicals (e.g., etchants) to a concentration less than about 2 atomic % (e.g., about 0 atomic % to about 1.9 atomic %).

In some embodiments, the deposition of doped oxide layer 609 can include depositing a carbon-doped silicon oxide layer, a nitrogen-doped silicon oxide layer, or a carbon- and nitrogen-doped silicon oxide layer on the structure of FIG. 5 with first (or top) portions 609a on hard mask layers 332 and gate spacers 114, second (or sidewall) portions 609b along sidewalls of S/D openings 410 and gate spacers 114, and a third (or bottom) portions 609c on surfaces of isolation openings 409. First portions 609a can have a thickness T1 of about 2 nm to about 5 nm, second portions 609b can have a thickness T2 of about 1 nm to about 5 nm, and third portions 609c can have a thickness T3 of about 5 nm to about 15 nm. In some embodiments, a ratio between thicknesses T2 and T1 (e.g., T2:T1) can be about 1:1 to about 1:2 and a ratio between thicknesses T3, T2, and T1 (e.g., T3:T2:T1) can be about 1:2:2 to about 1:3:3. In some embodiments, a difference between thicknesses T3 and T2 (e.g., T3−T2), and between thicknesses T3 and T1 (e.g., T3−T1) can be about 2 nm to about 10 nm. Within these relative thickness ranges of first, second, and third portions 609a-609c, doped oxide layer 609 can be subsequently processed (e.g., operation 225) to form first isolation layer 109A with a thickness for adequate electrical isolation between S/D regions 110 and fin structure 106 without compromising the device size and manufacturing cost.

Figure 7:
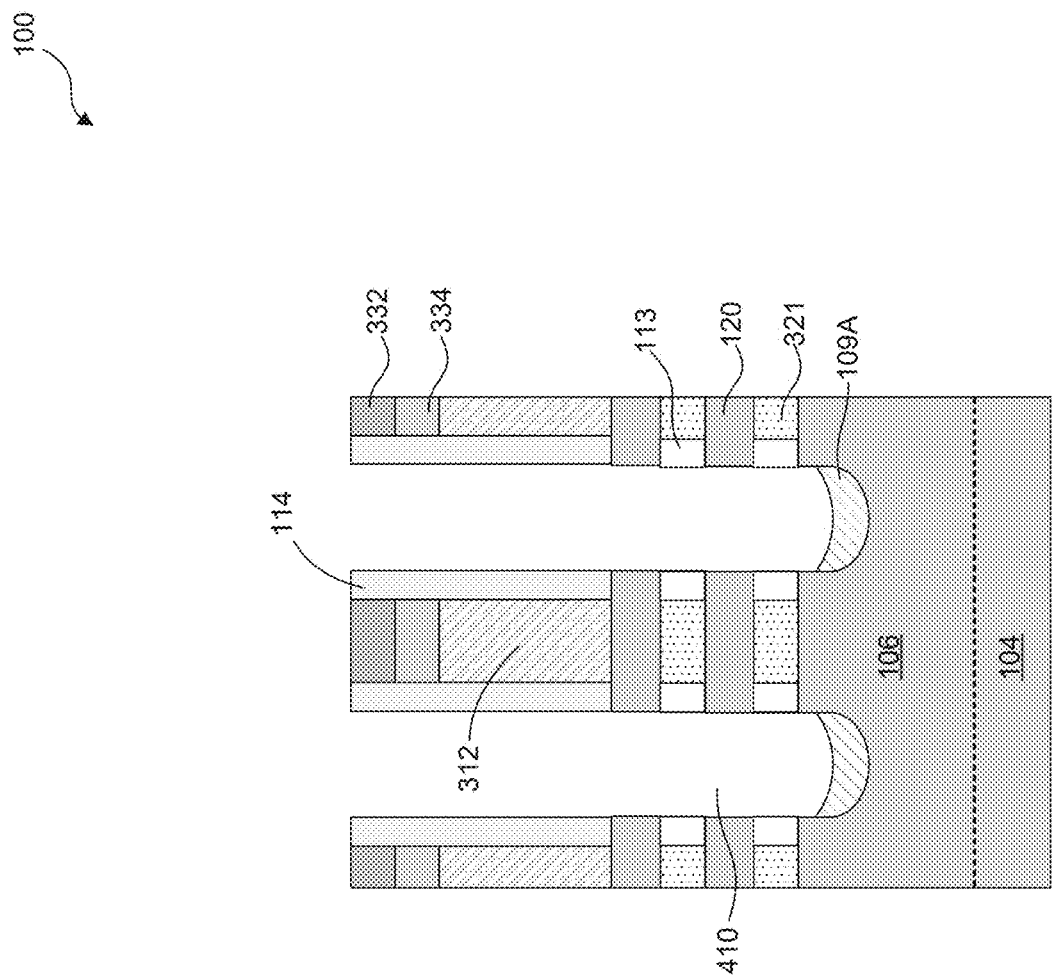

Referring to FIG. 2, in operation 225, top and sidewall portions of the doped oxide layer are removed to form first isolation layers. For example, as shown in FIG. 7, top portions 609a and sidewall portions 609b are removed to form first isolation layers 109A. In some embodiments, top portions 609a and sidewall portions 609b can be removed by performing a plasma etch process with radicals (e.g., radicals of fluorine atoms or oxygen atoms) on the structure of FIG. 6. In some embodiments, the removal of top portions 609a and sidewall portions 609b can include sequential operations of (i) generating radicals of halogen atoms (e.g., fluorine atoms) from source gases of carbon tetrafluoride ($CF_4$), fluoroform ($CHF_3$), fluoromethane ($CH_3F$), and/or generating radicals of oxygen atoms from source gases of oxygen, (ii) exposing the structure of FIG. 6 to the radicals of halogen atoms and/or oxygen atoms, and (iii) performing a cleaning process on the structure of FIG. 7 with a wet etch process using dilute hydrofluoric acid (DHF), phosphoric acid ($H_3PO_4$), hydrochloric acid (HCl), and/or a solution of hydrogen peroxide ($H_2O_2$), sulfuric acid ($H_2SO_4$) and water. In some embodiments, nitrogen, hydrogen, argon, and/or helium can be supplied with the sources gases. Top portions 609a and sidewall portions 609b are etched at a faster rate than bottom portions 609c due to the longer distance travelled by the etching radicals to reach bottom portions 609c. Also, due to bottom portions 609c being thicker than top portions 609a and sidewall portions 609b, a substantial thickness of bottom portions 609c remains to form first isolation layers 109A after top portions 609a and sidewall portions 609b are etched.

Referring to FIG. 2, in operations 230-245, second isolation layers are selectively formed on the first isolation layers. For example, second isolation layers 109B are selectively formed on first isolation layers 109A in operations 230-245, as described below with reference to FIGS. 8-12 and 15-16.

Figure 8:
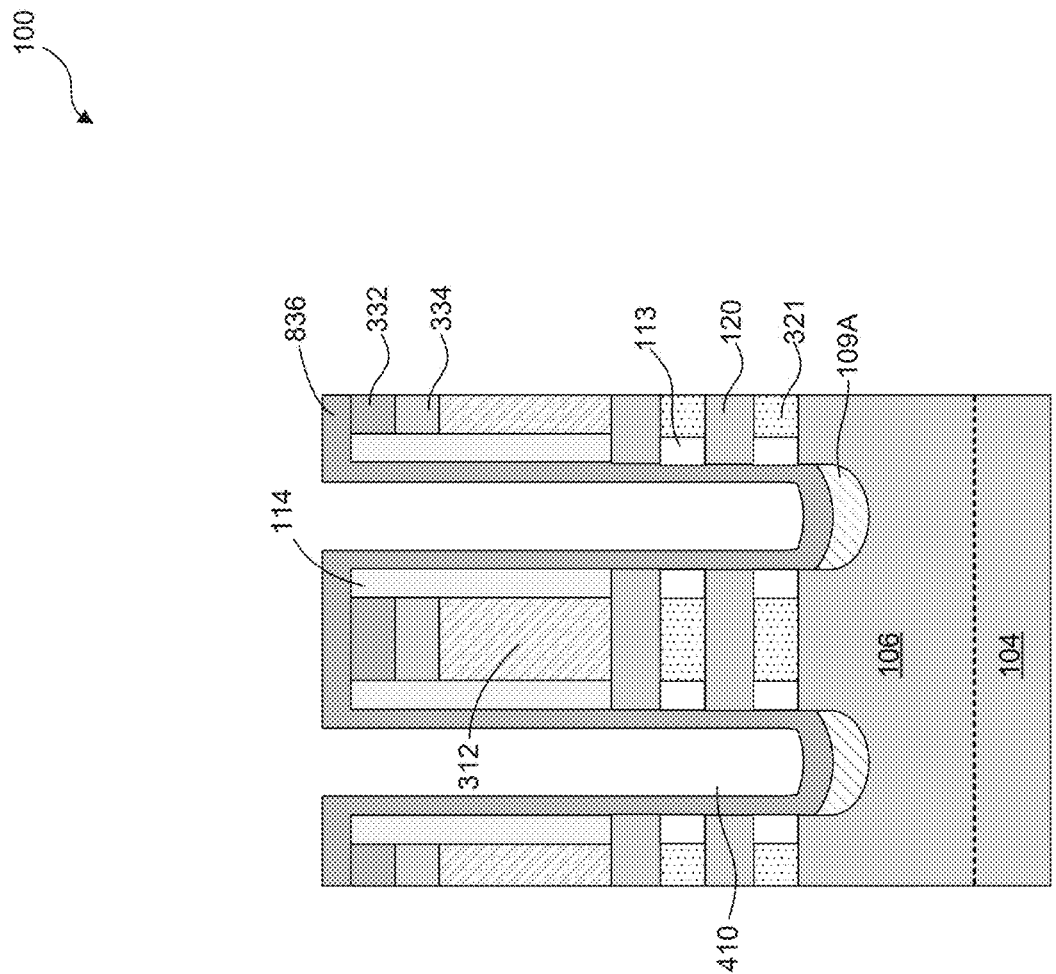
Figure 15:
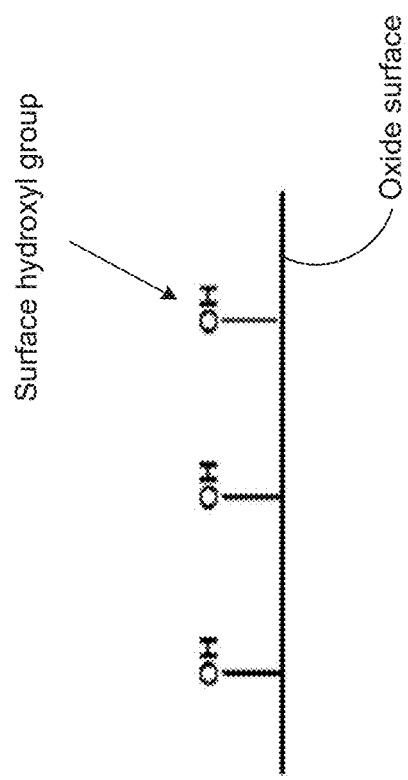

Referring to FIG. 2, in operation 230, an undoped oxide layer is deposited in the S/D openings and on the first isolation layers. For example, as shown in FIG. 8, an undoped oxide layer 836 is deposited in S/D openings 410 and on first isolation layers 109A. In some embodiments, undoped oxide layer 836 can include an undoped oxide layer (e.g., $SiO_2$) that has surface hydroxyl (—OH) groups, as shown in FIG. 15, with a concentration greater than about $2 \times 10^{14}/cm^2$ (e.g., about $2.1 \times 10^{14}/cm^2$ to about $6 \times 10^{14}/cm^2$). The surface hydroxyl groups can induce hydroxylation reactions with an inhibitor material to form an inhibitor layer 1038 in subsequent processing, as described in detail below with to reference to FIG. 10.

In some embodiments, the deposition of undoped oxide layer 836 can include conformally depositing a silicon oxide ($SiO_2$) layer with a thickness of about 3 nm to about 6 nm on the structure of FIG. 7 in an ALD process at a deposition temperature of about 70° C. to about 300° C. If the deposition temperature is above about 300° C., the surface hydroxyl groups cannot be preserved as the hydroxyl groups can dissociate from the oxide surface at temperatures above about 300° C. On the other hand, if the deposition temperature is below about 70° C., the precursors may not react to form the $SiO_2$ layer. In some embodiments, the silicon precursor used to deposit the $SiO_2$ layer can include silane ($SiH_4$), disilane ($Si_2H_6$), dichlorosilane ($SiCl_2H_2$), hexachlorosilane ($Si_2Cl_6$), or tetracholorsilane ($Si_2H_2Cl_4$) and the oxygen precursor can include oxygen, ozone, or water. Undoped oxide layer 836 is deposited with a thickness of about 3 nm to about 6 nm so that a thickness of about 2 nm to about 4 nm remains after an etching process is performed on undoped oxide layer 836 in subsequent operation 235, as described below.

Figure 9:
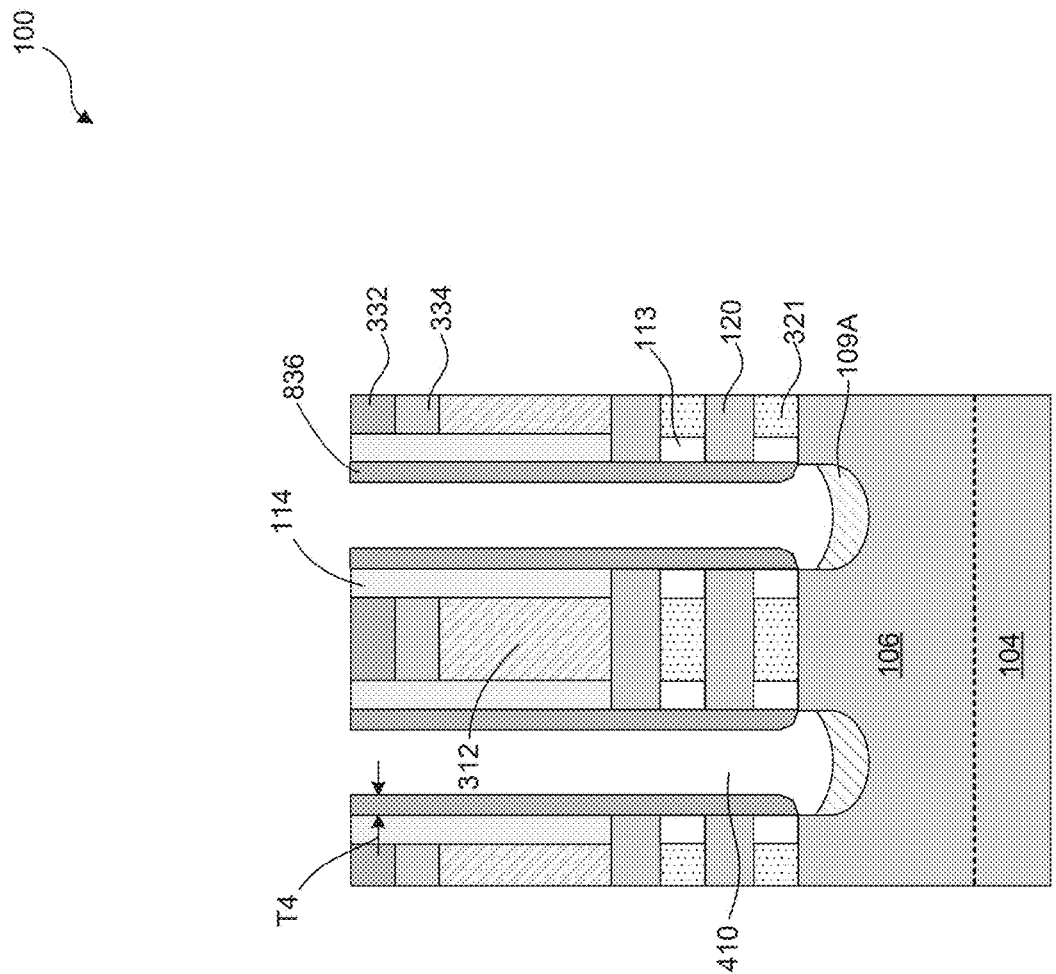

Referring to FIG. 2, in operation 235, top and bottom portions of the undoped oxide layer is removed. For example, as shown in FIG. 9, top portions of undoped oxide layer 836 on hard mask layers 332 and gate spacers 114 and bottom portions of undoped oxide layer 836 on first isolation layers 109A are removed. In some embodiments, top and bottom portions of undoped oxide layer 836 can be removed by performing a directional plasma etch process with radicals (e.g., radicals of fluorine atoms or oxygen atoms) on the structure of FIG. 8. The directional plasma etch process can remove top and bottom portions of undoped oxide layer 836 at a faster rate than the sidewall portions of undoped oxide layer 836. The sidewall portions of undoped oxide layer 836 remaining after the directional plasma etch process can have a thickness T4 of about 2 nm to about 4 nm. This range of thickness T4 provides substantially uniform thickness of sidewall portions of undoped oxide layer 836 for adequately forming inhibitor layer 1038 in subsequent operation 240 without compromising the device size and manufacturing cost. If thickness T4 is below about 2 nm, sidewall portions of undoped oxide layer 836 may not have substantially uniform thickness.

In some embodiments, the removal of top and bottom portions of undoped oxide layer 836 can include sequential operations of (i) generating radicals of halogen atoms (e.g., fluorine atoms) from source gases of carbon tetrafluoride ($CF_4$), fluoroform ($CHF_3$), fluoromethane ($CH_3F$), and/or generating radicals of oxygen atoms from source gases of oxygen, (ii) exposing the structure of FIG. 8 to the radicals of halogen atoms and/or oxygen atoms, and (iii) performing a cleaning process on the structure of FIG. 9 with a wet etch process using dilute hydrofluoric acid (DHF), phosphoric acid ($H_3PO_4$), hydrochloric acid (HCl), and/or a solution of hydrogen peroxide ($H_2O_2$), sulfuric acid ($H_2SO_4$) and water. In some embodiments, nitrogen, hydrogen, argon, and/or helium can be supplied with the sources gases. The plasma etch process of operation of 235 can have a higher bias applied to substrate 104 than that of operation 225 to induce a more directional etch on undoped oxide layer 836 than on doped oxide layer 609.

Figure 10:
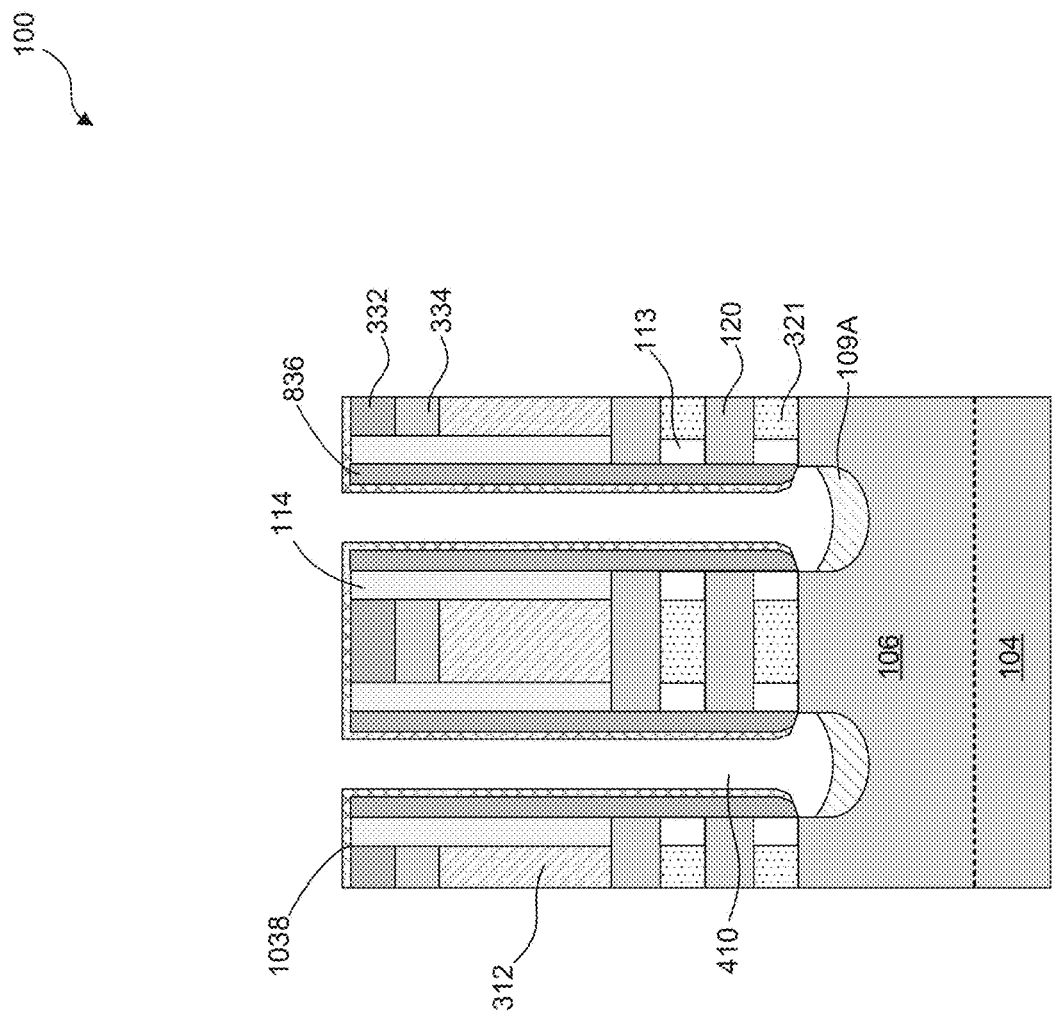

Referring to FIG. 2, in operation 240, an inhibitor layer is selectively formed on sidewall portions of the undoped oxide layer. For example, as shown in FIG. 10, inhibitor layer 1038 is selectively formed on sidewall portions of undoped oxide layer 836. In some embodiments, inhibitor layer 1038 can be formed on hard mask layer 332 and gate spacers 114, as shown in FIG. 10, if these include oxide materials with high concentration of surface hydroxyl groups.

In some embodiments, the selective formation of inhibitor layer 1038 can include wet chemical soaking the structure of FIG. 9 in a solution of an inhibitor material or dry chemical soaking the structure of FIG. 9 by exposing the structure of FIG. 9 to a gas of an inhibitor material. In some embodiments, the wet chemical soaking can be performed at a temperature of about 27° C. to about 300° C. for a duration of about 24 hours to about 30 hours. In some embodiments, the dry chemical soaking can be performed at a temperature of about 27° C. to about 300° C. for a duration of about 15 min to about 30 min. In some embodiments, the inhibitor material can include Octadecyltrichlorosilane ($CH_3(CH_2)_{17}SiCl_3$), Trichloro(1H, 1H,2H,2H-perfluorooctyl)silane ($CF_3(CF_2)_5(CH_2)_2SiCl_3$), Dimethyldichlorosilane (($CH_3)_2SiCl_2$), (Dimethylamino)trimethylsilane (($CH_3)_2NSi(CH_3)_3$), 1-(Trimethylsilyl)pyrrolidine (($CH_3)_3Si—NC_4H_8$), Hexamethyldisilazane ($[(CH_3)_3Si]_2NH$), Bis(dimethylamino)dimethylsilane ($[(CH_3)_2N]_2Si(CH_3)_2$), or any suitable alkylsilane self-assembled monolayers (SAMs).

Figure 16:
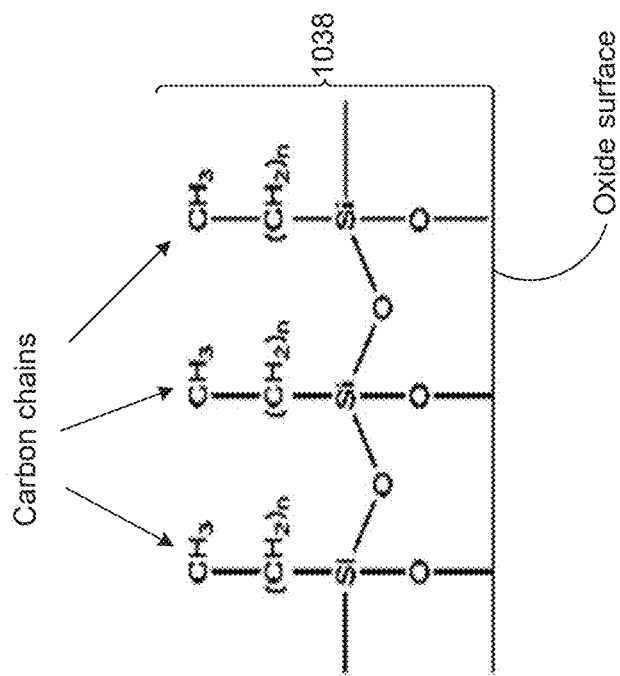
FIGS. 15-16 illustrate chemical structures on a surface of an undoped oxide layer of a semiconductor device at various stages of its fabrication process, in accordance with some embodiments.

The inhibitor materials selectively react with surface hydroxyl groups on oxide surfaces (FIG. 15) to form long carbon chains of inhibitor layer 1038 on oxide surfaces, as shown in FIG. 16. As a result, inhibitor layer 1038 selectively forms on sidewall portions of undoped oxide layer 836 because of its high concentration of surface hydroxyl groups, and not on first isolation layer 109A because of its very low or zero concentration of surface hydroxyl groups. The long carbon chains inhibit the deposition of second isolation layer 109B on inhibitor layer 1038 in subsequent operation 245, as described below.

Figure 11:
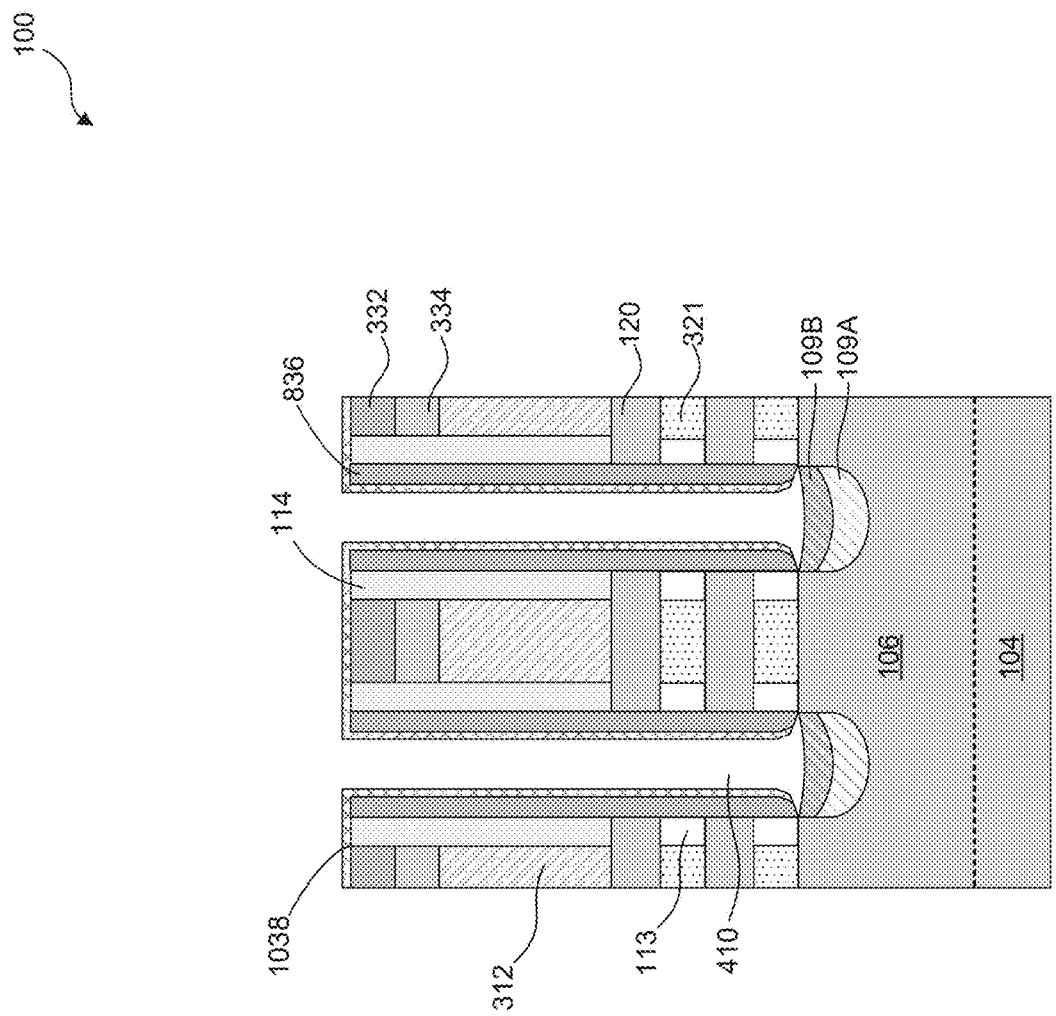
Figure 12:
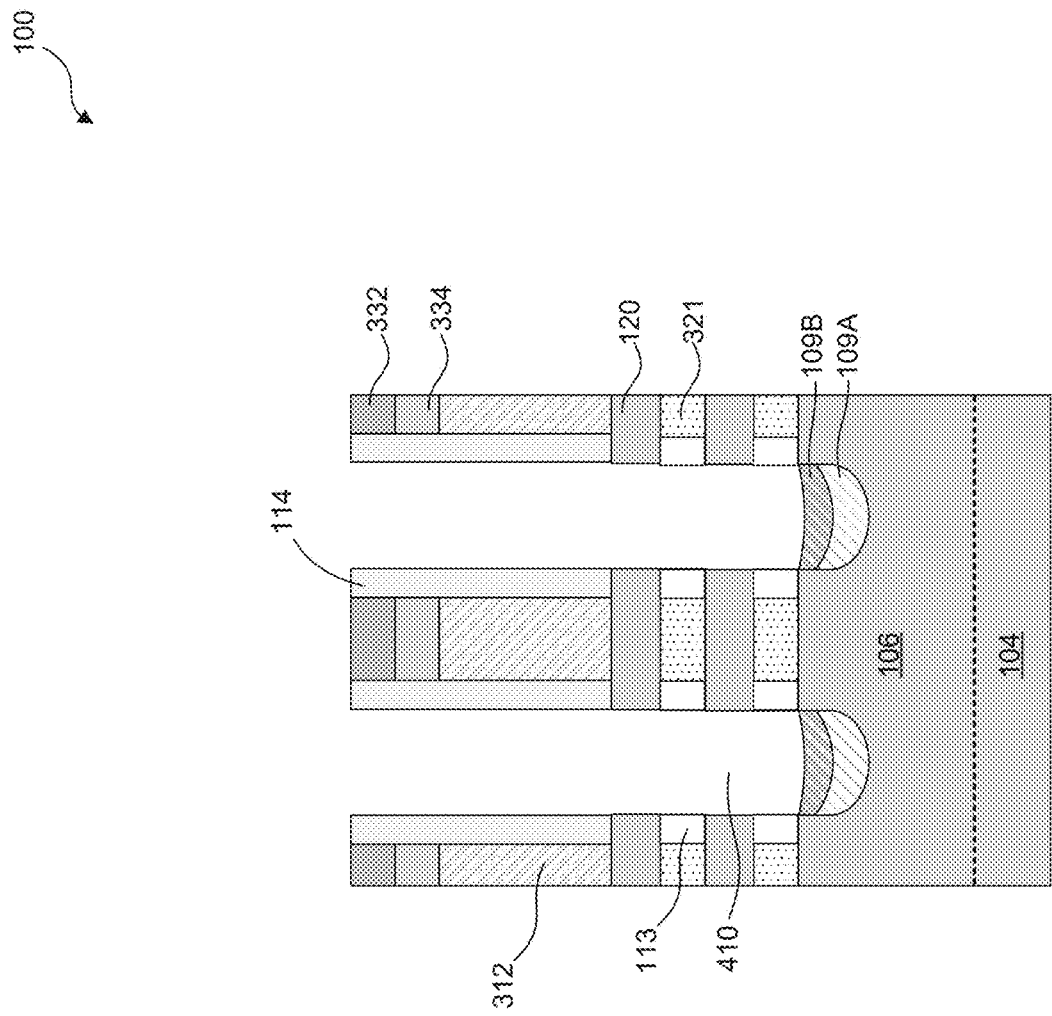

Referring to FIG. 2, in operation 245, a second isolation layer is selectively deposited on the first isolation layer. For example, as shown in FIG. 11, second isolation 109B is selectively formed on first isolation layer 109A. In some embodiments, the selective formation of second isolation 109B can include depositing a doped oxide layer, a doped carbide layer, a doped nitride layer, or an undoped silicon nitride layer on first isolation layer 109A using an ALD process without plasma, as plasma can remove inhibitor layer 1038. In some embodiments, the selective formation of second isolation 109B can include depositing a doped oxide, carbide, or nitride layer with a carbon concentration of about 1 atomic % to about 25 atomic % and a nitrogen concentration of about 1 atomic % to about 30 atomic %, and a carbon-to-nitrogen concentration ratio of about 0.2 to about 2. Following the formation of second isolation 109B, inhibitor layer 1038 and undoped oxide layer 836 are removed in a wet etch process with a solution of DHF to form the structure of FIG. 12.

Figure 13:
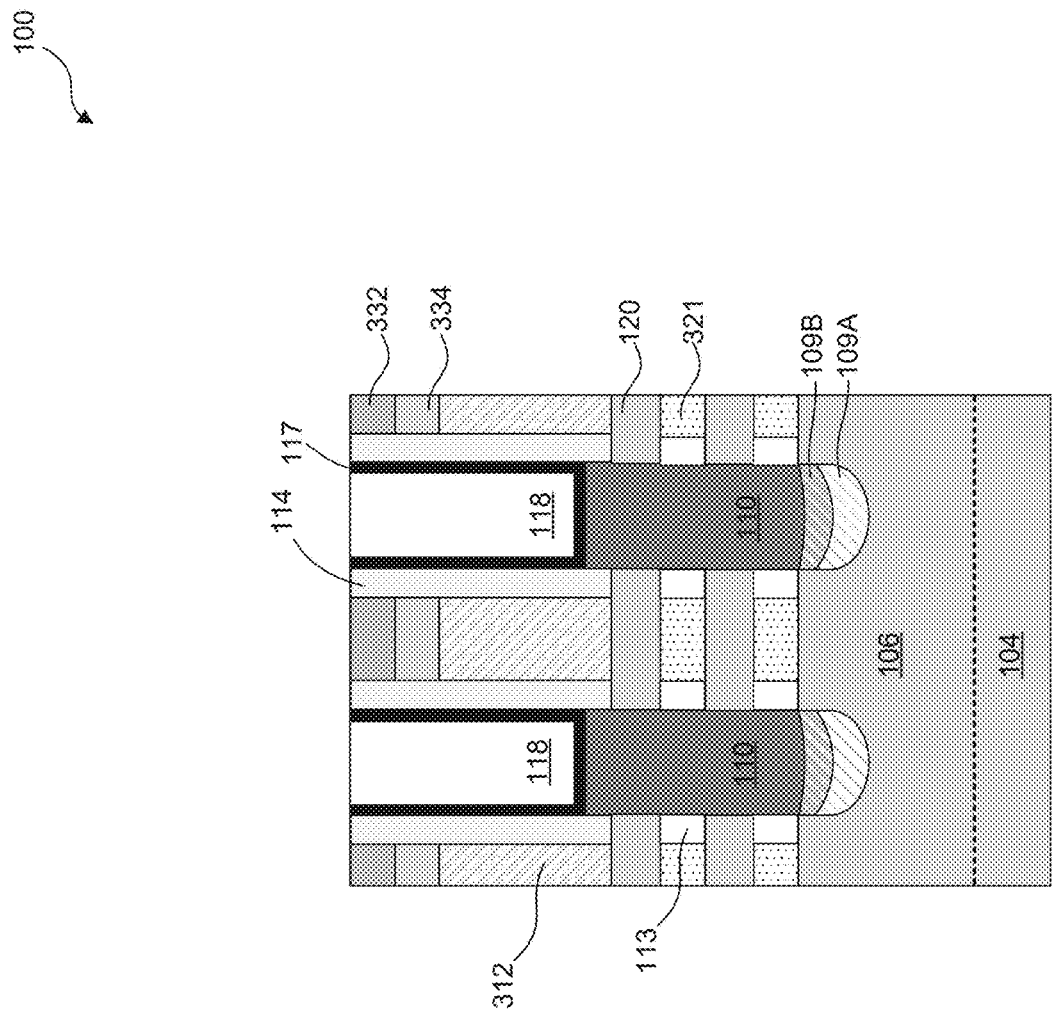

Referring to FIG. 2, in operation 250, S/D regions are formed in the S/D openings on the second isolation layers. For example, as shown in FIG. 13, S/D regions 110 are epitaxially formed in S/D openings 410 on second isolation layers 109B. In some embodiments, S/D regions 110 can epitaxially grow on sidewalls of nanostructured channel regions 120 facing S/D openings 410. After the formation of S/D regions 110, ESL 117 and ILD layer 118 can be formed to form the structure of FIG. 13.

Referring to FIG. 2, in operation 255, polysilicon structures and sacrificial layers of the superlattice structure are replaced with gate structures. For example, as shown in FIG. 14, polysilicon structures 312 and sacrificial layers 321 are replaced with gate structures 112. In some embodiments, gate structures 112 can be etched back to form gate capping layers 130, as shown in FIG. 14.

The present disclosure provides example semiconductor devices with FETs (e.g., FET 100) having isolation structures (e.g., isolation structure 108) between fin structures (e.g., fin structure 106) and source/drain (S/D) regions (e.g., S/D regions 110) and provides example methods (e.g., method 200) of forming such FETs on a substrate. The isolation structures prevent or minimize current leakage from S/D regions to fin structures and substrate. In some embodiments, each of the isolation structures can include a stack of first and second isolation layers (e.g., first and second isolation layers 109A-109B). The first isolation layer can include a doped oxide layer and the second isolation layer can include a doped oxide, carbide, or nitride layer. In some embodiments, the first and/or second isolation layers can have a carbon-to-nitrogen concentration ratio of about 0.2 to about 2 for low dielectric constant value of about 2 to about 5, density of about 1.5 gm/cm$^3$ to about 3 gm/cm$^3$, and etch selectivity over undoped oxide (e.g., silicon oxide ($SiO_2$)).

In some embodiments, the method of forming the first and second isolation layers include forming an isolation opening (e.g., isolation opening 409) in the fin structure, forming the first isolation layer in the isolation opening, and selectively depositing the second isolation layer on the first isolation layer. The selective deposition of the second isolation layer forms the second isolation layer with a top surface (109Bt) profile that is more planar than that formed with other methods, such as cyclic deposition-etch (CDE) processes. The top surface profile and dimensions (e.g., thickness) can be controlled more precisely in the selective deposition process than in CDE processes as controlling etching conditions and/or etch profiles in CDE processes are more challenging than controlling deposition conditions. The substantially planar top surface profile of the second isolation layer can prevent and/or substantially reduce the formation of voids at the interface between the second isolation layer and the S/D region formed on the second isolation layer, and consequently improve device performance.

In some embodiments, a method includes forming a fin structure on a substrate forming a superlattice structure with first and second nanostructured layers on the fin structure, forming a source/drain (S/D) opening in the superlattice structure, forming an isolation opening in the fin structure and below the S/D opening, forming a first isolation layer in the isolation opening, selectively forming an oxide layer on sidewalls of the S/D opening, selectively forming an inhibitor layer on the oxide layer, selectively depositing a second isolation layer on the first isolation layer, and forming S/D regions in the S/D opening on the second isolation layer.

In some embodiments, a method includes forming a superlattice structure on a fin structure, forming a first opening in the fin structure, forming a second opening in the superlattice structure, depositing a first doped oxide layer with a bottom portion in the first opening and a sidewall portion in the second opening, selectively removing the sidewall portion of the first doped oxide layer, forming an oxide layer on sidewalls of the second opening, forming an inhibitor layer on the oxide layer, depositing a second doped oxide layer on the bottom portion of the first doped oxide layer, and forming source/drain (S/D) regions in the second opening.

In some embodiments, a semiconductor device includes a substrate, a fin structure disposed on the substrate, a source/drain (S/D) region disposed on the fin structure, first and second dielectric layers disposed between the fin structure and the S/D region, and a gate structure disposed on the fin structure. Carbon and nitrogen concentrations in the second dielectric layer are greater than carbon and nitrogen concentrations in the first dielectric layer. A top surface of the first dielectric layer is lower than a top surface of the fin structure, and a top surface of the second dielectric layer is higher than the top surface of the fin structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin structure on a substrate;
   forming a superlattice structure with first and second nanostructured layers on the fin structure;
   forming a source/drain (S/D) opening in the superlattice structure;
   forming an isolation opening in the fin structure and below the S/D opening;
   forming a first isolation layer in the isolation opening;
   depositing an oxide layer with a bottom oxide portion on and in contact with a top surface of the first isolation layer and a sidewall oxide portion on sidewalls of the first nanostructured layers exposed in the S/D opening;
   removing the bottom oxide portion of the oxide layer from the top surface of the first isolation layer;
   forming an inhibitor layer on the sidewall oxide portion of the oxide layer after removing the bottom oxide portion of the oxide layer;
   depositing a second isolation layer on the first isolation layer; and
   forming S/D regions in the S/D opening on the second isolation layer.

2. The method of claim 1, wherein forming the first isolation layer comprises depositing a carbon-doped or nitrogen-doped oxide layer in the isolation opening.

3. The method of claim 1, wherein forming the first isolation layer comprises depositing an oxide layer with a carbon concentration of about 1 atomic % to about 25 atomic % and a nitrogen concentration of about 1 atomic % to about 30 atomic % in the isolation opening.

4. The method of claim 1, wherein forming the first isolation layer comprises depositing an oxide layer with a carbon-to-nitrogen concentration ratio of about 0.2 to about 2 in the isolation opening.

5. The method of claim 1, wherein depositing the oxide layer comprises:
   depositing an undoped oxide layer with the bottom oxide portion on and in contact with the top surface of the first isolation layer and a sidewall oxide portion on the sidewalls of the S/D opening an.

6. The method of claim 1, wherein depositing the oxide layer comprises depositing a silicon oxide layer with the bottom oxide portion on and in contact with the top surface of the first isolation layer and a sidewall oxide portion on the sidewalls of the S/D opening, wherein the silicon oxide layer comprises surface hydroxyl groups with a concentration of about $2.1 \times 10^{14}/cm^2$ to about $6 \times 10^{14}/cm^2$.

7. The method of claim 1, wherein forming the inhibitor layer comprises wet chemical soaking the oxide layer in a solution of an inhibitor material.

8. The method of claim 1, wherein forming the inhibitor layer comprises exposing the oxide layer to a gas of an inhibitor material.

9. The method of claim 1, wherein depositing the second isolation layer comprises depositing a doped oxide, carbide, or nitride layer with a carbon concentration of about 1 atomic % to about 25 atomic % and a nitrogen concentration of about 1 atomic % to about 30 atomic % on the first isolation layer.

10. The method of claim 1, wherein depositing the second isolation layer comprises depositing a doped oxide, carbide, or nitride layer with a carbon-to-nitrogen concentration ratio of about 0.2 to about 2 on the first isolation layer.

11. The method of claim 1, wherein forming the S/D regions comprises epitaxially growing a semiconductor material on sidewalls of the first nanostructured layers facing the S/D opening.

12. The method of claim 1, further comprising replacing the second nanostructured layers with gate structures.

13. A method, comprising:
   forming a superlattice structure on a fin structure;
   forming a first opening in the fin structure;
   forming a second opening in the superlattice structure;
   depositing a first doped oxide layer with a bottom portion in the first opening and a sidewall portion in the second opening;
   removing the sidewall portion of the first doped oxide layer;
   forming an oxide layer on sidewalls of the second opening;
   forming an inhibitor layer on the oxide layer;
   depositing a second doped oxide layer on the bottom portion of the first doped oxide layer; and
   forming source/drain (S/D) regions in the second opening.

14. The method of claim 13, wherein removing the sidewall portion of the first doped oxide layer comprises exposing the sidewall portion to radicals of halogen atoms or oxygen atoms.

15. The method of claim 13, wherein forming the inhibitor layer comprises exposing the oxide layer to an alkylsilane self-assembled monolayer.

16. The method of claim 13, wherein depositing the second doped oxide layer comprises depositing a dielectric layer with a carbon-to-nitrogen concentration ratio of about 0.2 to about 2 on the bottom portion of the first doped oxide layer.

17. A semiconductor device, comprising:
   a substrate;
   a fin structure disposed on the substrate;
   a source/drain (S/D) region disposed on the fin structure;
   a first dielectric layer disposed in the fin structure and under the S/D region;
   a second dielectric layer disposed on the first dielectric layer, in the fin structure, and under the S/D region,
      wherein sidewalls of the second dielectric layer is in contact with sidewalls of the fin structure, and
      wherein carbon and nitrogen concentrations in the second dielectric layer are greater than carbon and nitrogen concentrations in the first dielectric layer, and
   a gate structure disposed on the fin structure.

18. The semiconductor device of claim 17, wherein each of the first and second dielectric layers comprises a carbon-to-nitrogen concentration ratio of about 0.2 to about 2.

19. The semiconductor device of claim 17, wherein each of the first and second dielectric layers comprises a carbon concentration of about 1 atomic % to about 25 atomic % and a nitrogen concentration of about 1 atomic % to about 30 atomic %.

20. The semiconductor device of claim 17, wherein each of the first and second dielectric layers comprises a density of about 1.5 $gm/cm^3$ to about 3 $gm/cm^3$.

* * * * *